(12) United States Patent
Wu et al.

(10) Patent No.: US 9,653,488 B2
(45) Date of Patent: May 16, 2017

(54) SEMICONDUCTOR DEVICE AND MANUFACTURING METHOD THEREOF

(71) Applicants: HANNSTAR DISPLAY (NANJING) CORPORATION, Nanjing (CN); HANNSTAR DISPLAY CORPORATION, Taipei (TW)

(72) Inventors: Chien-Hao Wu, Taipei (TW); Yi-Ting Lee, Taipei (TW); Hsien-Tang Hu, Taipei (TW)

(73) Assignees: Hannstar Display (Nanjing) Corporation, Nanjing (CN); Hannstar Display Corporation, Taipei (TW)

( * ) Notice: Subject to any disclaimer, the term of this patent is extended or adjusted under 35 U.S.C. 154(b) by 0 days.

(21) Appl. No.: 14/995,515

(22) Filed: Jan. 14, 2016

(65) Prior Publication Data
US 2016/0204137 A1 Jul. 14, 2016

(30) Foreign Application Priority Data

Jan. 14, 2015 (CN) .......................... 2015 1 0018147
Jan. 14, 2015 (CN) .......................... 2015 1 0018598
Jan. 14, 2015 (CN) .......................... 2015 1 0019433

(51) Int. Cl.
*H01L 27/12* (2006.01)
*H01L 29/786* (2006.01)
*H01L 29/66* (2006.01)

(52) U.S. Cl.
CPC ...... *H01L 27/1225* (2013.01); *H01L 27/1255* (2013.01); *H01L 29/66969* (2013.01); *H01L 29/7869* (2013.01); *H01L 29/78618* (2013.01); *H01L 29/78642* (2013.01); *H01L 29/78693* (2013.01)

(58) Field of Classification Search
CPC ....................... H01L 27/1225; H01L 29/7869
See application file for complete search history.

(56) References Cited

U.S. PATENT DOCUMENTS

2016/0005770 A1* 1/2016 Inoue .................. H01L 27/1225
257/43

* cited by examiner

*Primary Examiner* — Tran Tran
(74) *Attorney, Agent, or Firm* — Muncy, Geissler, Olds & Lowe, P.C.

(57) ABSTRACT

A manufacturing method of a semiconductor device comprises the steps of: providing a transparent substrate; forming a gate electrode on the transparent substrate; forming a gate insulation layer covering the gate electrode; forming an oxide semiconductor layer on the gate insulation layer and at least partially over the gate electrode; forming an etching stop layer over the gate electrode and at least covering a part of the oxide semiconductor layer, wherein the etching stop layer includes an opening; forming an electrode layer at the opening and on a part of the etching stop layer; and applying a low-resistance treatment to a part of the oxide semiconductor layer uncovered by the etching stop layer and the electrode layer to form a pixel electrode.

13 Claims, 19 Drawing Sheets

SEMICONDUCTOR DEVICE AND MANUFACTURING METHOD THEREOF

CROSS REFERENCE TO RELATED APPLICATIONS

This Non-provisional application claims priority under 35 U.S.C. §119(a) on Patent Application No(s). 201510018598.1 filed in People's Republic of China on Jan. 14, 2015, Patent Application No(s). 201510019433.6 filed in People's Republic of China on Jan. 14, 2015, and Patent Application No(s). 201510018147.8 filed in People's Republic of China on Jan. 14, 2015, the entire contents of which are hereby incorporated by reference.

BACKGROUND

Technical Field

This invention relates to a semiconductor device and a manufacturing method thereof and, in particular, to a semiconductor device formed by oxide semiconductor and a manufacturing method thereof and, especially, to an active matrix substrate of a liquid crystal display (LCD) device or an organic electroluminescent (EL) display device and a manufacturing method thereof. Herein, a semiconductor device includes an active matrix substrate or a display device including the same.

Related Art

Photo engraving process (PEP) is a common technology used in the semiconductor process, and a single PEP usually includes the steps such as deposition, development and etching. In the current manufacturing process of the thin film transistor (TFT) substrate, the structure such as gate electrode, drain electrode, source electrode, channel, etching stop layer, passivation layer or pixel electrode is usually formed through the photo engraving process, so that the process is complicated and the alignment tolerance will be easily caused.

SUMMARY

A manufacturing method of a semiconductor device comprises the steps of: providing a transparent substrate; forming a gate electrode on the transparent substrate; forming a gate insulation layer covering the gate electrode; forming an oxide semiconductor layer on the gate insulation layer and at least partially over the gate electrode; forming an etching stop layer over the gate electrode and at least covering a part of the oxide semiconductor layer, wherein the etching stop layer includes an opening; forming an electrode layer at the opening and on a part of the etching stop layer; and applying a low-resistance treatment to a part of the oxide semiconductor layer uncovered by the etching stop layer and the electrode layer to form a pixel electrode.

In one embodiment, before forming the gate insulation layer, the manufacturing method further comprises a step of: forming a common electrode on the transparent substrate, wherein the common electrode and the gate electrode are disposed coplanarly and by an interval and the gate insulation layer further covers the common electrode.

In one embodiment, the manufacturing method further comprises: forming a passivation layer covering the pixel electrode, the etching stop layer and the electrode layer; and forming a common electrode on the passivation layer.

In one embodiment, the low-resistance treatment includes a vacuum plasma treatment or a high-temperature annealing treatment.

In one embodiment, the oxide semiconductor layer is a multi-layer structure.

In one embodiment, the manufacturing method further comprises a step of: applying a doping treatment to the oxide semiconductor layer.

A semiconductor device comprises a transparent substrate, a gate electrode, a gate insulation layer, an oxide semiconductor layer, an etching stop layer and an electrode layer. The gate electrode is disposed on the transparent substrate. The gate insulation layer covers the gate electrode. The oxide semiconductor layer is disposed on the gate insulation layer and at least partially over the gate electrode. The etching stop layer is disposed over the gate electrode and at least covers a part of the oxide semiconductor layer, and includes an opening. The electrode layer is disposed at the opening and on a part of the etching stop layer. A part of the oxide semiconductor layer uncovered by the etching stop layer and the electrode layer is a pixel electrode.

In one embodiment, the semiconductor device further comprises a common electrode disposed on the transparent substrate. The common electrode and the gate electrode are disposed coplanarly and by an interval and the gate insulation layer further covers the common electrode.

In one embodiment, the semiconductor device further comprises a passivation layer and a common electrode. The passivation layer covers the pixel electrode, the etching stop layer and the electrode layer. The common electrode is disposed on the passivation layer.

In one embodiment, the material of the common electrode includes ITO, IZO, FTO, AZO, GZO or IGZO.

In one embodiment, if the material of the common electrode is IGZO, the common electrode is subjected to a low-resistance treatment to become an electrode.

In one embodiment, the electrode layer is electrically connected with the oxide semiconductor layer through the opening.

In one embodiment, the oxide semiconductor layer is a multi-layer structure.

In one embodiment, the material of the gate insulation layer includes SiOx, SiNx, SiOxNy or polyimide (PI).

In one embodiment, the material of the oxide semiconductor layer includes IGZO.

In one embodiment, the part of the oxide semiconductor layer connected to the pixel electrode from the electrode layer is a channel area.

In one embodiment, the oxide semiconductor layer includes a first oxide semiconductor layer and a second oxide semiconductor layer, the first oxide semiconductor layer is disposed between the gate insulation layer and the second oxide semiconductor layer, and the second oxide semiconductor layer is doped with p-type impurity or n-type impurity.

In one embodiment, the pixel electrode further includes a first oxide semiconductor layer and a second oxide semiconductor layer.

A semiconductor device comprises a transparent substrate, a gate electrode, a gate insulation layer, an oxide semiconductor layer, an etching stop layer and an electrode layer. The gate electrode is disposed on the transparent substrate. The gate insulation layer covers the gate electrode. The oxide semiconductor layer is disposed on the gate insulation layer and at least partially over the gate electrode. The etching stop layer is disposed over the gate electrode and at least covers a part of the oxide semiconductor layer. The electrode layer is disposed on a part of the oxide semiconductor layer. A part of the oxide semiconductor layer uncovered by the etching stop layer and the electrode layer is a pixel electrode.

In one embodiment, the electrode layer and the oxide semiconductor layer are electrically connected with each other.

Summarily, in the semiconductor device and the manufacturing method thereof, the part of the oxide semiconductor layer uncovered by the etching stop layer is subjected to the low-resistance treatment to become the pixel electrode and there is thus no need to dispose an additional pixel electrode layer. Therefore, the photo engraving process can be saved and the tolerance resulted from the formation of the pixel electrode layer also can be avoided.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1:
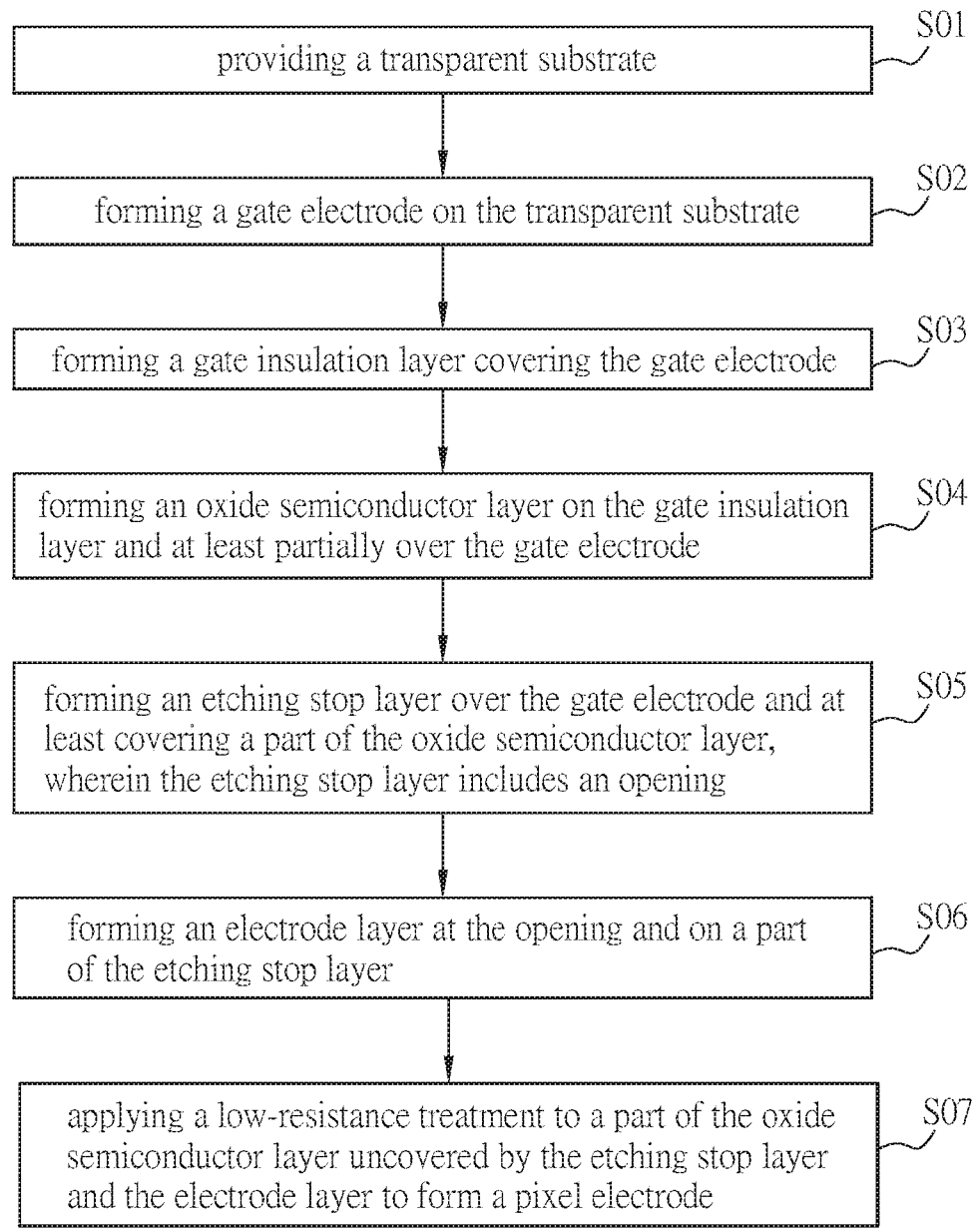
FIG. 1 is a schematic flowchart of a manufacturing method of a semiconductor device of an embodiment.
Figure 4:
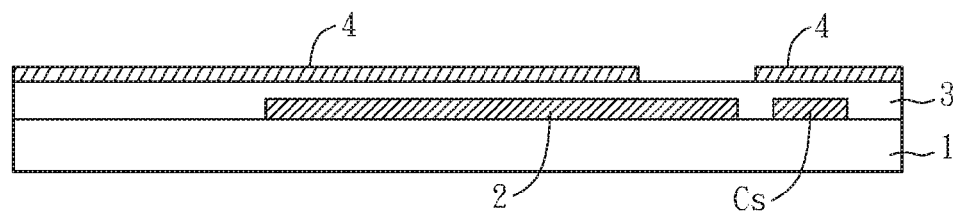
Figure 5:
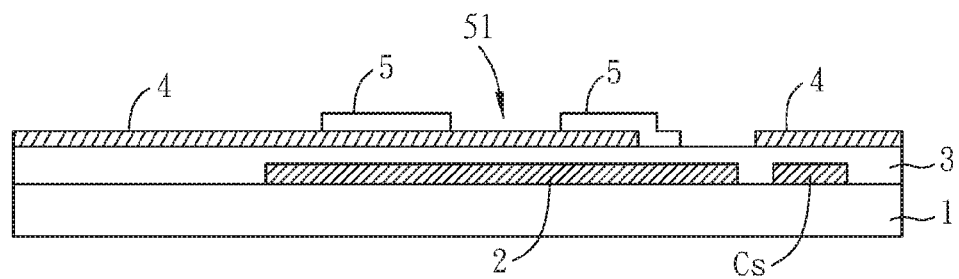
Figure 6:
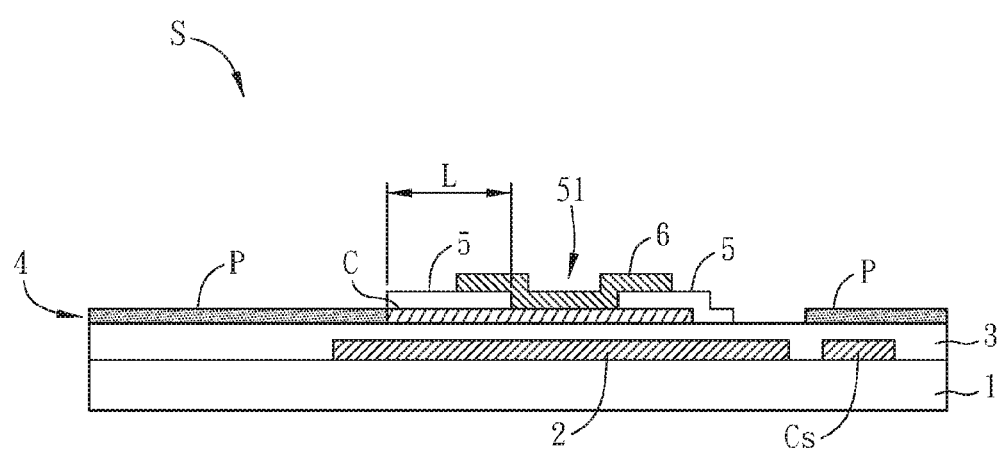
FIG. 6 is a schematic sectional diagram of a semiconductor device of an embodiment.

FIG. 1 is a schematic flowchart of a manufacturing method of a semiconductor device of an embodiment, FIGS. 2 to 5 are schematic diagrams showing the manufacturing processes of the semiconductor device, and FIG. 6 is a schematic sectional diagram of a semiconductor device of an embodiment. Referring to FIG. 1 with FIGS. 2 to 6, the semiconductor device S and the manufacturing method thereof according to this invention can be applied to an active matrix substrate, such as a TFT array substrate, of an LCD device or an organic EL display device. Herein, the semiconductor device S can include an active matrix substrate or a display device including the active matrix substrate.

The manufacturing method of the semiconductor device S includes the following steps of: providing a transparent substrate (S01); forming a gate electrode on the transparent substrate (S02); forming a gate insulation layer covering the gate electrode (S03); forming an oxide semiconductor layer on the gate insulation layer and at least partially over the gate electrode (S04); forming an etching stop layer over the gate electrode and at least covering a part of the oxide semiconductor layer, wherein the etching stop layer includes an opening (S05); forming an electrode layer at the opening and on a part of the etching stop layer (S06); and applying a low-resistance treatment to a part of the oxide semiconductor layer uncovered by the etching stop layer and the electrode layer to form a pixel electrode (S07).

Figure 2:
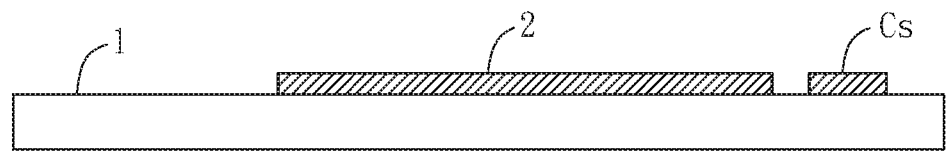
FIGS. 2 to 5 are schematic diagrams showing the manufacturing processes of the semiconductor device.

In the steps S01 and S02, as shown in FIG. 2, a transparent substrate 1 is provided. The transparent substrate 1 can be a glass substrate, a plastic substrate or a sapphire substrate. Then, a gate electrode 2 is formed on the transparent substrate 1. Physically, in the formation of the gate electrode 2, a metal layer can be deposited on the transparent substrate 1 by the sputtering and covered by a photoresist layer, and then the manufacturing processes such as the exposure, the development and the etching are applied to the photoresist layer through the photomask to form the gate electrode 2. The material of the metal layer (with the gate electrode 2 formed by the metal layer) can include Ta, Nd, Cr, W, Ti, Mo, Al, Cu, or any combination thereof.

In the step S02, a storage capacitance Cs also can be formed on the transparent substrate 1. The storage capacitance Cs and the gate electrode 2 are disposed by an interval and coplanarly on the transparent substrate 1. In other words, the storage capacitance Cs and the gate electrode 2 are formed by the same process.

Figure 3:
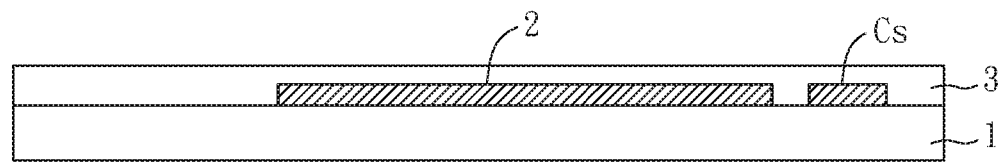

Then, as shown in FIG. 3, a gate insulation layer 3 is formed to cover the gate electrode 2. In the step S03, the gate insulation layer 3 can be formed on the transparent substrate 1 by the chemical vapor deposition (CVD) for example. The material of the gate insulation layer 3 includes $SiO_x$, $SiN_x$, $SiO_xN_y$, $Al_2O_3$, AlN or polyimide (PI). Besides, in this embodiment, the gate insulation layer 3 further covers the storage capacitance Cs.

As shown in FIG. 4, in the step S04, an oxide semiconductor layer 4 is formed on the gate insulation layer 3 and at least partially over the gate electrode 2. The oxide semiconductor layer 4 can include IGZO (indium gallium zinc oxide). Physically, in the formation of the IGZO, an amorphous IGZO layer can be deposited on the gate insulation layer 3 by the sputtering and covered by a photoresist layer, and then the manufacturing processes such as the exposure, the development and the etching are applied to the photoresist layer through the photomask to form the crystalline IGZO (i.e. the oxide semiconductor 4). Moreover, in this embodiment, the oxide semiconductor 4 is also formed over the storage capacitance Cs.

Then, in the step S05, as shown in FIG. 5, an etching stop layer 5 is formed over the gate electrode 2 and at least covering a part of the oxide semiconductor layer 4. In this embodiment, the etching stop layer 5 includes an opening 51 which is disposed over the oxide semiconductor layer 4. Besides, in the step S06 shown in FIG. 6, an electrode layer 6 is formed at the opening 51 and on a part of the etching stop layer 5, so that the electrode layer 6 can be electrically connected with the oxide semiconductor layer 4 through the opening 51, wherein the electrode layer 6 acts as the source electrode/drain electrode. Herein, the material of the electrode layer 6 can include Ta, Nd, Cr, W, Ti, Mo, Al, Cu, or any combination thereof. Moreover, the electrode layer 6 and the gate electrode 2 can have the same or different material.

Figure 7:
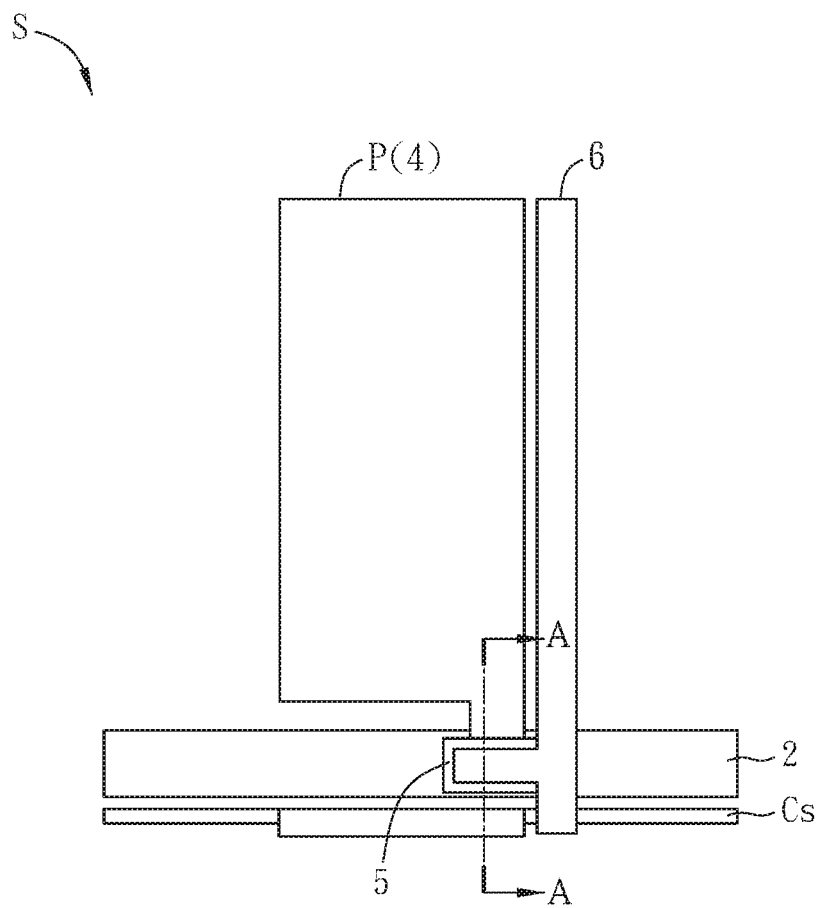
FIG. 7 is a schematic top-view diagram of the semiconductor device of FIG. 6.

In the step S07, a low-resistance treatment is applied to the part of the oxide semiconductor layer 4 uncovered by the etching stop layer 5 and the electrode layer 6 to form a pixel electrode P. Refer to FIGS. 6 and 7, wherein FIG. 7 is a schematic top-view diagram of the semiconductor device of FIG. 6 and FIG. 6 is a schematic sectional diagram taken along the line A-A of FIG. 7. Because the exposed part of the oxide semiconductor layer 4 is subjected to a low-resistance treatment to become a conductor, it can act as the pixel electrode P. Besides, for the clearness purpose, the gate insulation layer 3 is not shown in FIG. 7.

Physically, the low-resistance treatment can include vacuum plasma treatment or high-temperature annealing treatment. The low-resistance treatment is, for example, the hydrogen plasma treatment including the chemical vapor deposition (CVD) apparatus, the argon plasma treatment including the etching apparatus, the high-temperature annealing treatment under the reduction environment, or the combination of the hydrogen plasma treatment and the high-temperature annealing treatment.

Otherwise, for example, the part of the oxide semiconductor layer 4 uncovered by the etching stop layer 5 is subjected to the high temperature treatment from 250° C. to 400° C. under the hydrogen environment for one to two hours, so that the oxygen ions of the oxide semiconductor layer 4 will be reduced to become a conductor. Herein, the part of the oxide semiconductor layer 4 which is covered by the etching stop layer 5 so as not to undergo the low-resistance treatment and also connected to the pixel electrode P from the electrode layer 6 is the channel area C, the length L of which is marked in FIG. 6.

Accordingly, a part of the oxide semiconductor layer 4 is subjected to the low-resistance treatment to become the pixel electrode P and there is thus no need to dispose an additional pixel electrode layer. Therefore, the photo engraving process can be saved.

Accordingly, the semiconductor device S formed by the above-mentioned manufacturing method includes a transparent substrate 1, a gate electrode 2, a gate insulation layer 3, an oxide semiconductor layer 4, an etching stop layer 5 and an electrode layer 6, wherein a part of the oxide semiconductor layer 4 is subjected to a low-resistance treatment to become a pixel electrode P. Moreover, since the descriptions about the all elements have been provided above, they are omitted here for conciseness.

The semiconductor device S can further include a passivation layer (not shown), which is disposed on the pixel electrode P and the electrode layer 6 to prevent the external conductor from contacting the pixel electrode P or the electrode layer 6 and thus avoid the accompanying electric interference.

Figure 8A:
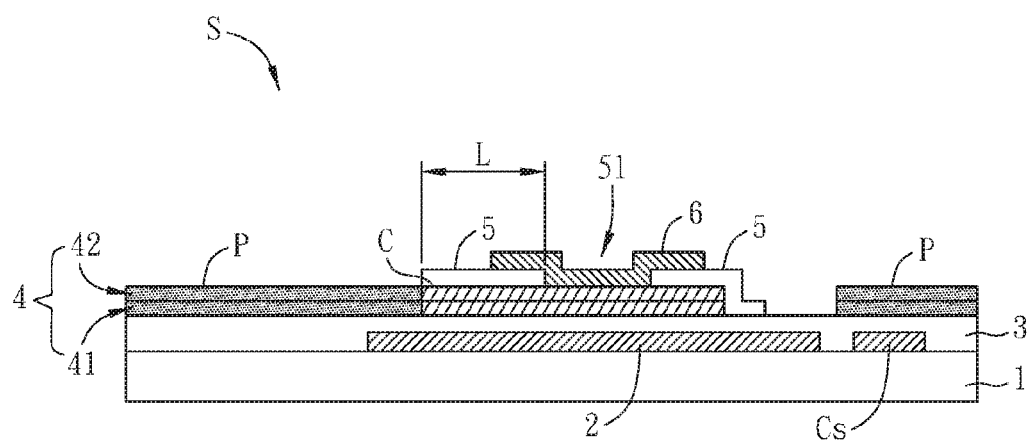
FIGS. 8A and 8B are schematic diagrams of different embodiments of the semiconductor device.
Figure 8B:
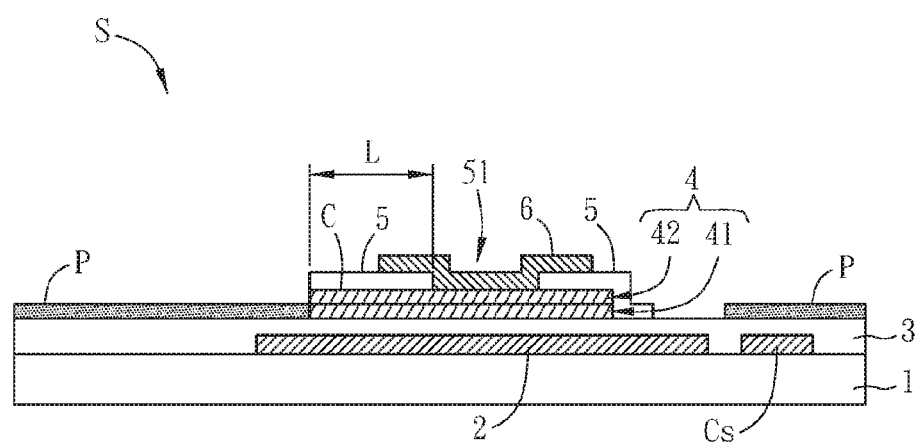
Figure 9:
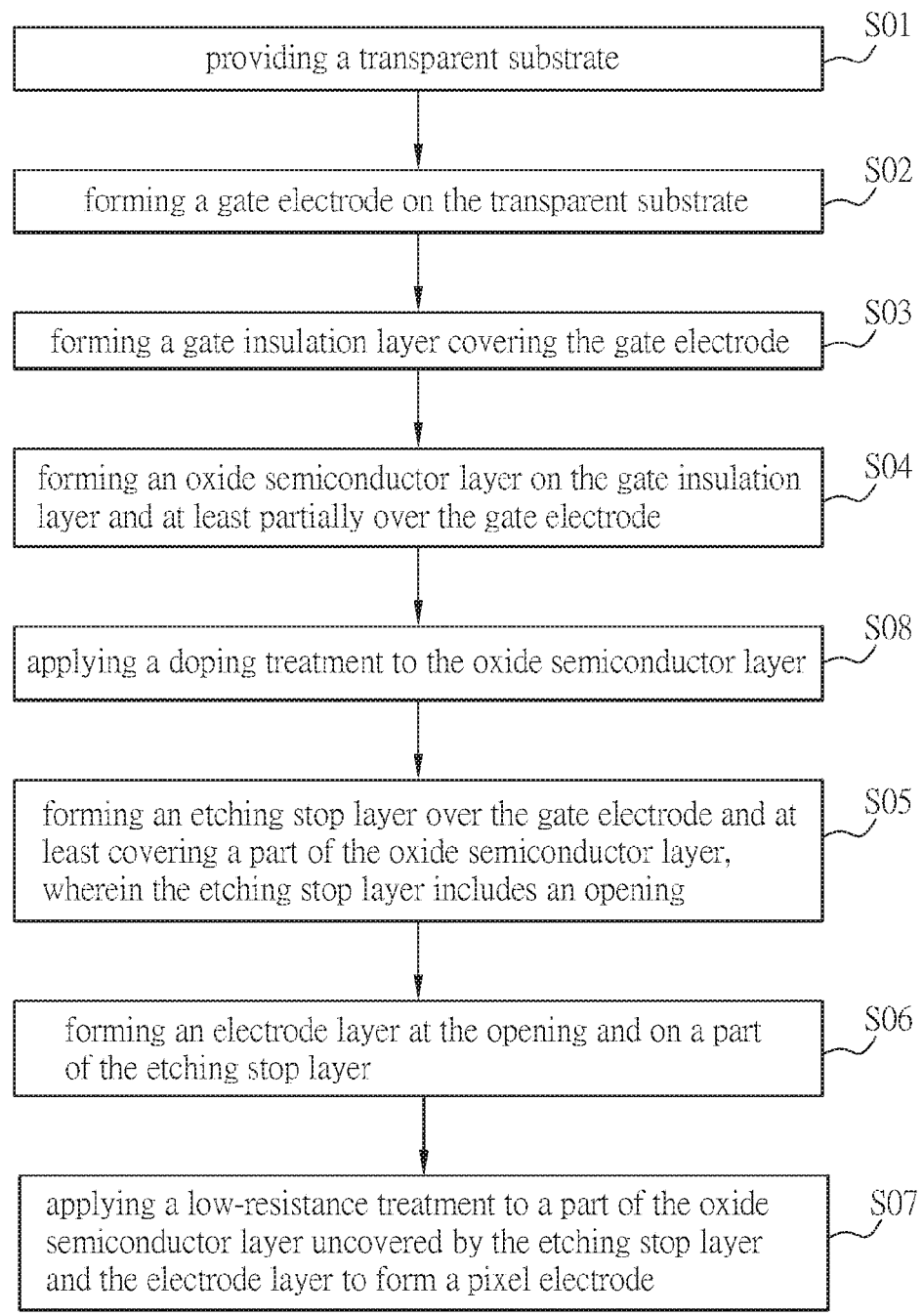
FIG. 9 is a schematic flowchart of a manufacturing method of another semiconductor device of the embodiment of FIG. 1.
Figure 10:
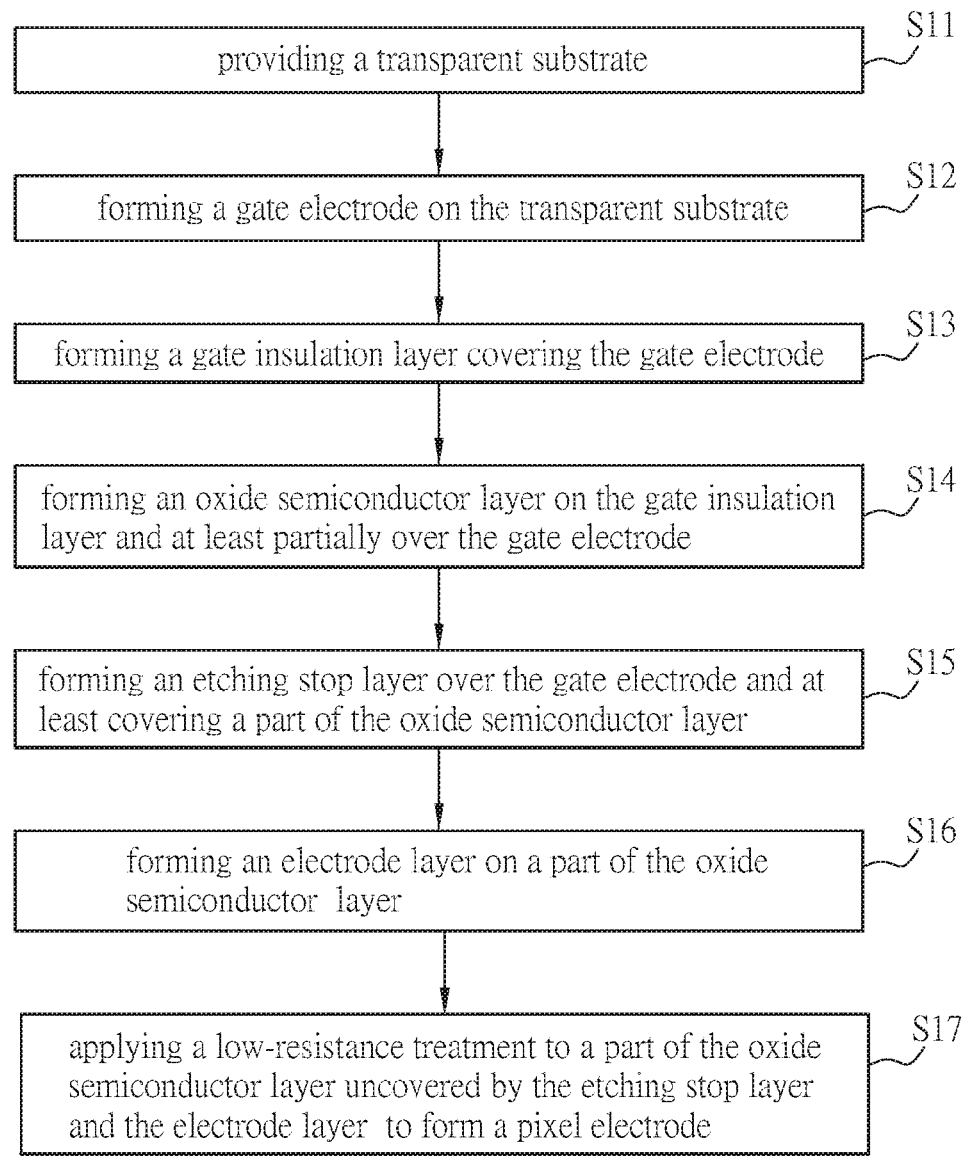
FIG. 10 is a schematic flowchart of a manufacturing method of a semiconductor device of another embodiment.

Moreover, the oxide semiconductor layer 4 can be a multi-layer structure. FIGS. 8A and 8B are schematic diagrams of different embodiments of the semiconductor device. As shown in FIG. 8A, in this embodiment, the oxide semiconductor layer 4 includes a first oxide semiconductor layer 41 and a second oxide semiconductor layer 42, and the first oxide semiconductor layer 41 is disposed between the gate insulation layer 3 and the second oxide semiconductor layer 42. The second oxide semiconductor layer 42 shown in FIG. 8B is just disposed under the etching stop layer 5 for increasing the sectional area of the channel area C. In these embodiments, the second oxide semiconductor layer 42 can be doped with the p-type impurity such as boron (B) or the n-type impurity such as phosphorus (P), so as to be configured with a better conductivity. Herein, the manufacturing method can further include a step of applying a doping treatment to the oxide semiconductor layer (S08), as shown in FIG. 9. The doping of the n-type impurity can be implemented by using SiH4 and PH3 as the reactant gases and through the plasma-enhanced chemical vapor deposition (PECVD) method, the vapor deposition method or the sputtering method. Moreover, the diffusion method or the ion implantation method also can be used to introduce the impurity elements into the amorphous silicon film, and the favorable case is that heating is used to diffuse the impurity elements after the impurity elements are introduced by using the ion implantation method for example. The doping of the p-type impurity can be implemented, for example, by using SiH4 and B2H6 as the reactant gases and through the plasma-enhanced chemical vapor deposition (PECVD) method, the vapor deposition method or the sputtering method. Moreover, the diffusion method or the ion implantation method also can be used to introduce the impurity elements into the amorphous silicon film, and the favorable case is that heating is used to diffuse the impurity elements after the impurity elements are introduced by using the ion implantation method for example.

Figure 13:
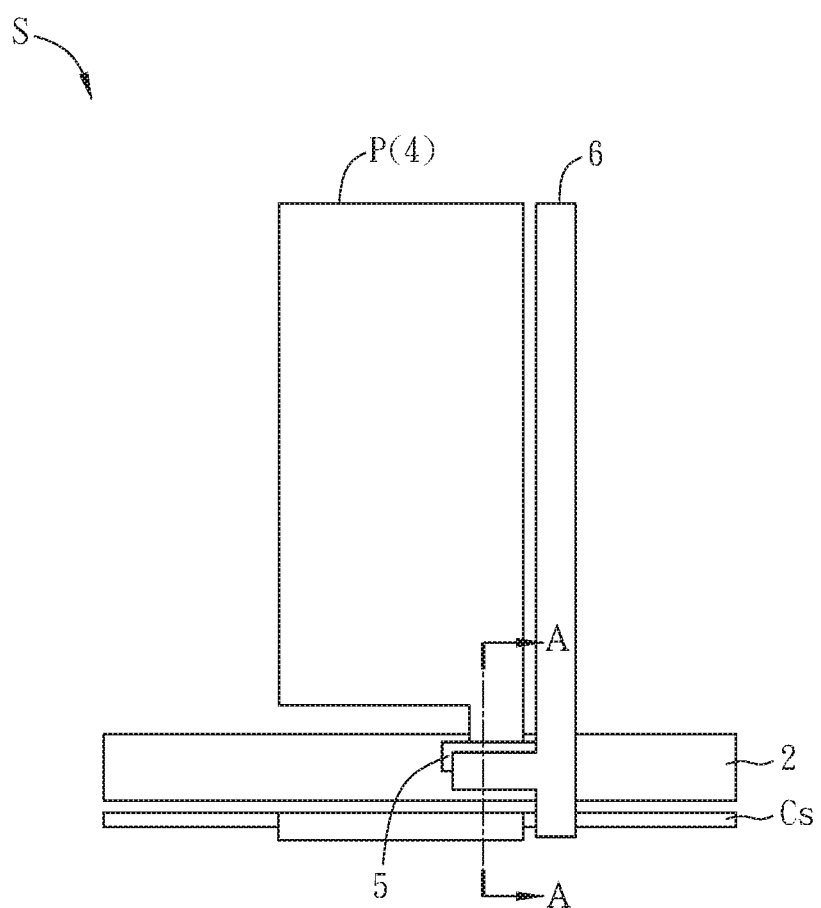
FIG. 13 is a schematic top-view diagram of the semiconductor device of FIG. 12.

Another semiconductor device and a manufacturing method thereof are further provided by this invention. As shown in FIGS. 10 to 13, wherein FIG. 13 is a schematic top-view diagram of the semiconductor device of FIG. 12, this embodiment is implemented by the structure of the channel protection (CHP) and the manufacturing method includes the following steps of: providing a transparent substrate (S11); forming a gate electrode on the transparent substrate (S12); forming a gate insulation layer covering the gate electrode (S13); forming an oxide semiconductor layer on the gate insulation layer and at least partially over the gate electrode (S14); forming an etching stop layer over the gate electrode and at least covering a part of the oxide semiconductor layer (S15); forming an electrode layer on a part of the oxide semiconductor layer (S16); and applying a low-resistance treatment to a part of the oxide semiconductor layer uncovered by the etching stop layer and the electrode layer to form a pixel electrode (S17). The descriptions about the steps S11 to S14 can be comprehended by referring to those of the steps S01 to S04 and the description about the step S17 can be comprehended by referring to that of the step S07, and therefore they are omitted here for conciseness.

Figure 11:
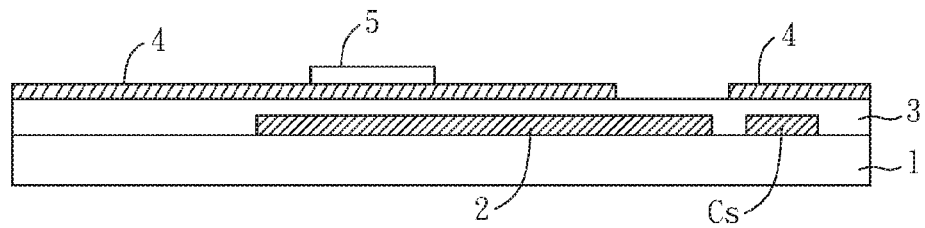
FIG. 11 is a schematic diagram showing the manufacturing process of the semiconductor device.
Figure 12:
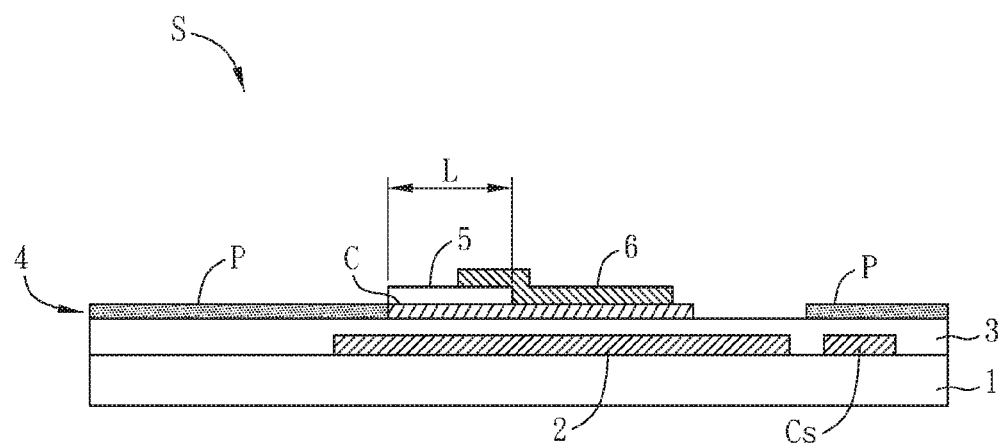
FIG. 12 is a schematic sectional diagram of a semiconductor device of an embodiment.

The main difference from the above embodiments is that in the step S15 shown in FIG. 11, the etching stop layer 5 in this embodiment is formed over the gate electrode 2, at least covers a part of the oxide semiconductor layer 4 and includes no opening. Therefore, in the step S16 of FIG. 12, an electrode layer 6 is formed on a part of the oxide semiconductor layer 4, so that the electrode layer 6 can be electrically connected with the oxide semiconductor layer 4. The electrode layer 6 acts as the source electrode/drain electrode and, unlike the above embodiment, a part of the electrode layer 6 is not disposed in the opening.

In addition, another semiconductor device and a manufacturing method thereof are further provided in this invention.

Figure 14:
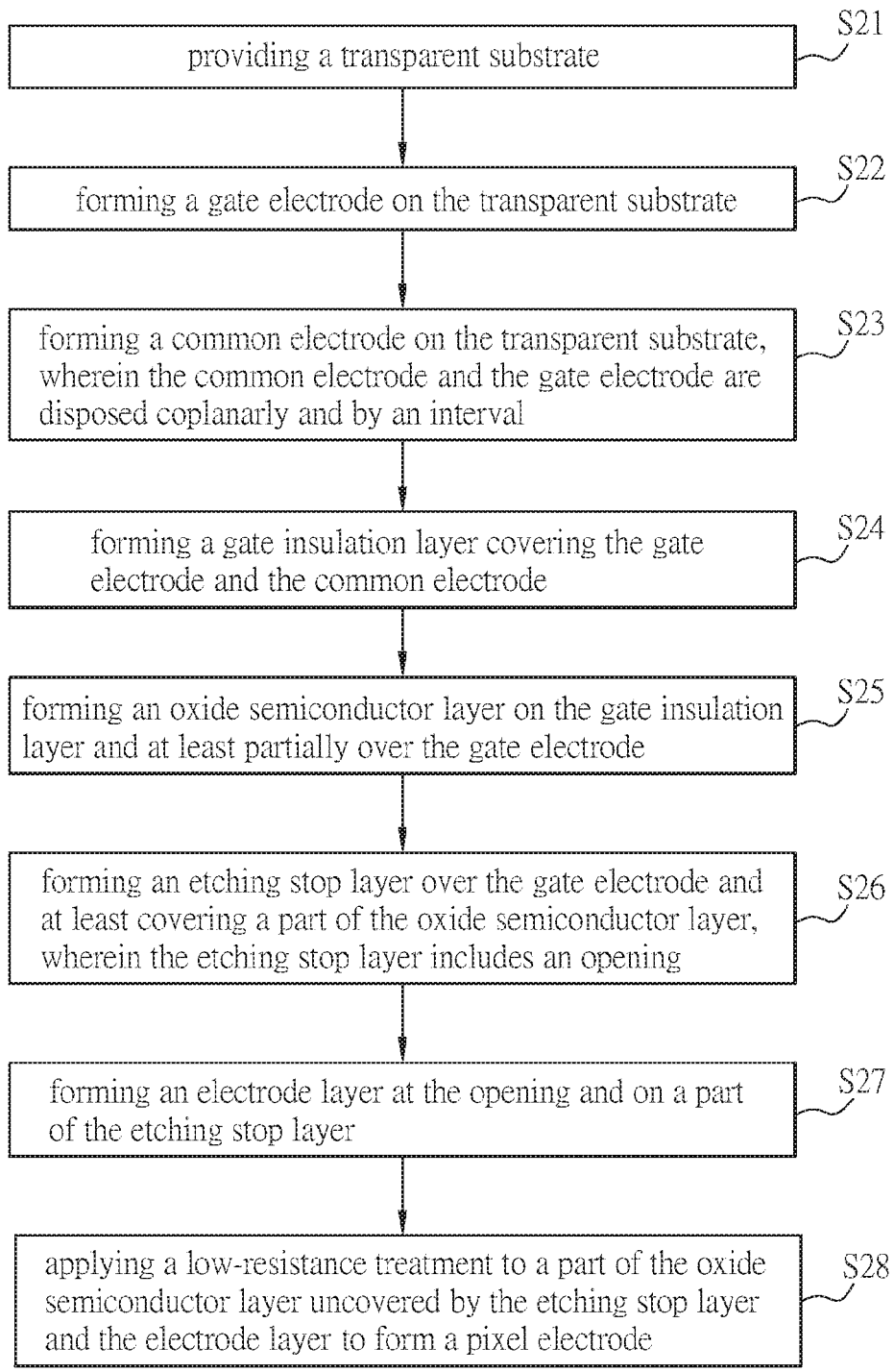
FIG. 14 is a schematic flowchart of a manufacturing method of a semiconductor device of another embodiment.
Figure 17:
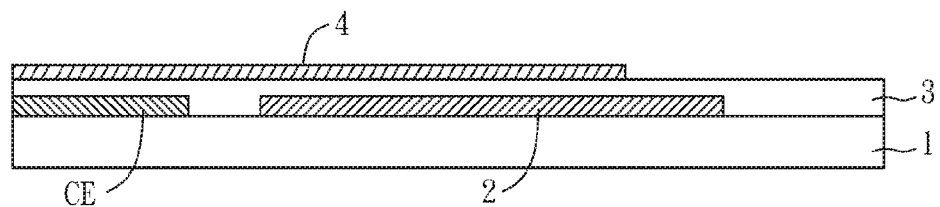
Figure 18:
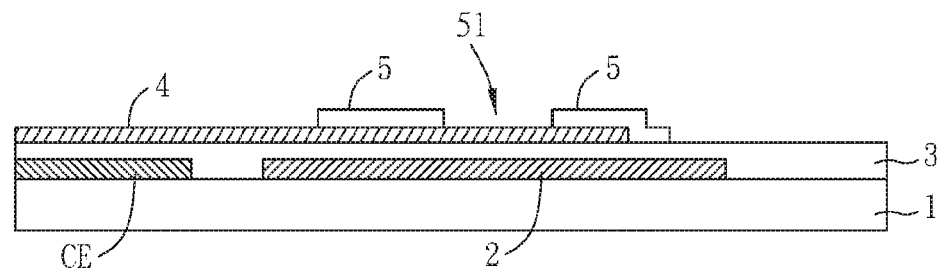
Figure 19:
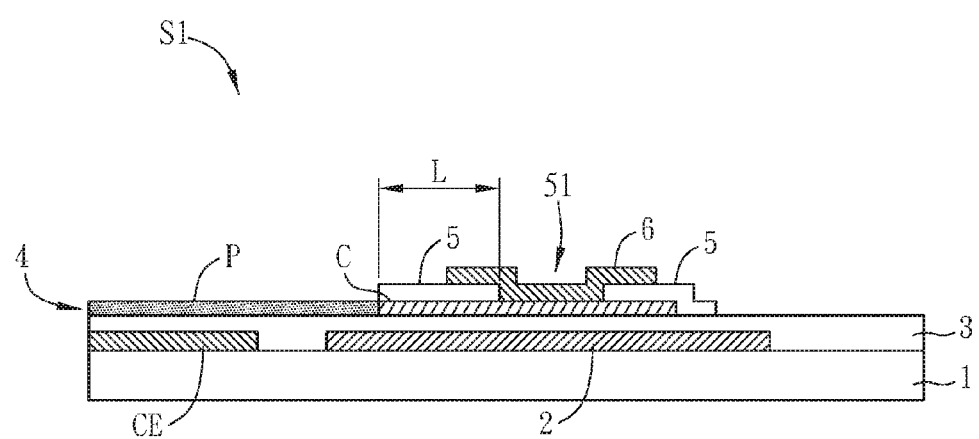
FIG. 19 is a schematic sectional diagram of a semiconductor device of the embodiment of FIG. 14.

FIG. 14 is a schematic flowchart of a manufacturing method of a semiconductor device of another embodiment, FIGS. 15 to 18 are schematic diagrams showing the manufacturing process of the semiconductor device, and FIG. 19 is a schematic sectional diagram of a semiconductor device 51 of this embodiment. Referring to FIG. 14 with FIGS. 15 to 19, the semiconductor device 51 and the manufacturing method thereof according to this invention can be applied to an active matrix substrate of an LCD device or an organic EL display device, such as a TFT array substrate, and especially to the active matrix substrate of the LCD device of the fringe field switching (FFS) technology. Herein, the semiconductor device 51 can include an active matrix substrate or a display device including the active matrix substrate.

The manufacturing method of the semiconductor device 51 includes the following steps of: providing a transparent substrate (S21); forming a gate electrode on the transparent substrate (S22); forming a common electrode on the transparent substrate, wherein the common electrode and the gate electrode are disposed coplanarly and by an interval (S23); forming a gate insulation layer covering the gate electrode and the common electrode (S24); forming an oxide semiconductor layer on the gate insulation layer and at least partially over the gate electrode (S25); forming an etching stop layer over the gate electrode and at least covering a part of the oxide semiconductor layer, wherein the etching stop layer includes an opening (S26); forming an electrode layer at the opening and on a part of the etching stop layer (S27); and applying a low-resistance treatment to a part of the oxide semiconductor layer uncovered by the etching stop layer and the electrode layer to form a pixel electrode (S28).

Figure 15:
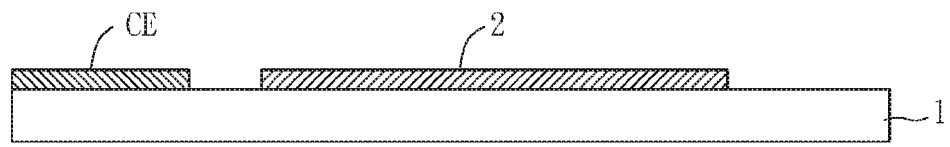
FIGS. 15 to 18 are schematic diagrams showing the manufacturing processes of the semiconductor device.

In the steps S21 and S22, as shown in FIG. 15, a transparent substrate 1 is provided. The transparent substrate 1 can be a glass substrate, a plastic substrate or a sapphire substrate. Then, a gate electrode 2 is formed on the transparent substrate 1. Physically, in the formation of the gate electrode 2, a metal layer can be deposited on the transparent substrate 1 by the sputtering and covered by a photoresist layer, and then the manufacturing processes such as the exposure, the development and the etching are applied to the photoresist layer through the photomask to form the gate electrode 2. The material of the metal layer (with the gate electrode 2 formed by the metal layer) can include Ta, Nd, Cr, W, Ti, Mo, Al, Cu, or any combination thereof.

In the step S23, the common electrode CE and the gate electrode 2 are disposed coplanarly on the transparent substrate 1 and disposed by an interval for electric isolation. The material of the common electrode CE can include a conducting layer, such as ITO (indium tin oxide), IZO (indium zinc oxide), FTO (fluorine doped tin oxide), AZO (aluminum doped zinc oxide) or GZO (gallium doped zinc oxide), which can be formed by the processes such as deposition, exposure, development and etching. To be noted, the material of the common electrode CE also can be an oxide semiconductor layer, such as IGZO. If the material of the common electrode CE is IGZO, the common electrode CE can be subjected to a low-resistance treatment to become a conductor.

For example, the common electrode CE using the IGZO is subjected to the high temperature treatment from 250° C. to 400° C. under the hydrogen environment for one to two hours, so that the oxygen ions of the common electrode CE will be reduced to form a conductor.

Figure 16:
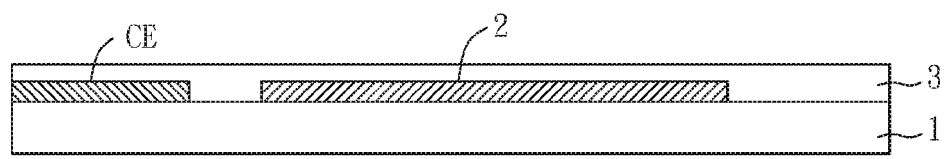

Then, as shown in FIG. 16, a gate insulation layer 3 is formed to cover the gate electrode 2. In the step S24, the gate insulation layer 3 can be formed on the transparent substrate 1 by the chemical vapor deposition (CVD) for example. The material of the gate insulation layer 3 includes $SiO_x$, $SiN_x$, $SiO_xN_y$, $Al_2O_3$, AlN or polyimide (PI). Besides, in this embodiment, the gate insulation layer 3 further covers the common electrode CE.

As shown in FIG. 17, in the step S25, an oxide semiconductor layer 4 is formed on the gate insulation layer 3 and at least partially over the gate electrode 2. The oxide semiconductor layer 4 can include IGZO. Physically, in the formation of the IGZO, an IGZO layer can be deposited on the gate insulation layer 3 by the sputtering and covered by a photoresist layer, and then the manufacturing processes such as the exposure, the development and the etching are applied to the photoresist layer through the photomask to form the IGZO (i.e. the oxide semiconductor 4). Moreover, in this embodiment, the oxide semiconductor 4 is further extended to be formed over the common electrode CE.

Then, in the step S26, as shown in FIG. 18, an etching stop layer 5 is formed over the gate electrode 2 and at least covering a part of the oxide semiconductor layer 4. In this embodiment, the etching stop layer 5 includes an opening 51 which is disposed over the oxide semiconductor layer 4. Besides, in the step S27 shown in FIG. 19, an electrode layer 6 is formed at the opening 51 and on a part of the etching stop layer 5, so that the electrode layer 6 can be electrically connected with the oxide semiconductor layer 4 through the opening 51, wherein the electrode layer 6 acts as the source electrode/drain electrode. Herein, the material of the electrode layer 6 can include Ta, Nd, Cr, W, Ti, Mo, Al, Cu, or any combination thereof. Moreover, the electrode layer 6 and the above-mentioned metal layer can have the same or different material.

Figure 20:
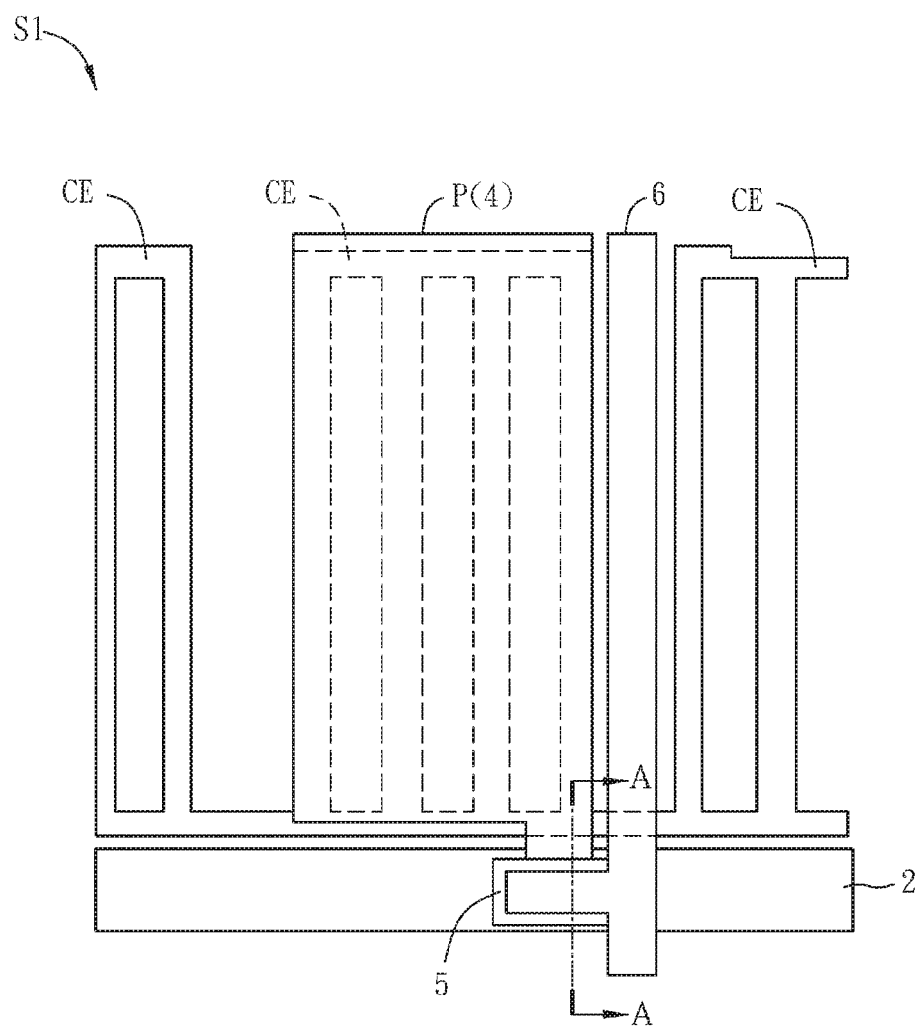
FIG. 20 is a schematic top-view diagram of the semiconductor device of FIG. 19.

In the step S28, a low-resistance treatment is applied to the part of the oxide semiconductor layer 4 uncovered by the etching stop layer 5 and the electrode layer 6 to form a pixel electrode P. Refer to FIGS. 19 and 20, wherein FIG. 20 is a schematic top-view diagram of the semiconductor device of FIG. 19 and FIG. 19 is a schematic sectional diagram taken along the line A-A of FIG. 20. Because the exposed part of the oxide semiconductor layer 4 is subjected to a low-resistance treatment to become a conductor, it can act as the pixel electrode P. Besides, for the clearness purpose, the gate insulation layer 3 is not shown in FIG. 20.

Otherwise, for example, the part of the oxide semiconductor layer 4 uncovered by the etching stop layer 5 is subjected to the high temperature treatment from 250° C. to 400° C. under the hydrogen environment for one to two hours, so that the oxygen ions of the oxide semiconductor layer 4 will be reduced to become a conductor. Herein, the part of the oxide semiconductor layer 4 which is covered by the etching stop layer 5 so as not to undergo the low-resistance treatment and also connected to the pixel electrode P from the electrode layer 6 is the channel area C, the length L of which is marked in FIG. 19.

Accordingly, a part of the oxide semiconductor layer 4 is subjected to the low-resistance treatment to become the pixel electrode P and there is thus no need to dispose an additional pixel electrode layer. Therefore, the photo engraving process can be saved.

Accordingly, the semiconductor device S1 formed by the above-mentioned manufacturing method includes a transparent substrate 1, a gate electrode 2, a common electrode CE, a gate insulation layer 3, an oxide semiconductor layer 4, an etching stop layer 5 and an electrode layer 6, wherein a part of the oxide semiconductor layer 4 is subjected to a low-resistance treatment to become a pixel electrode P.

In this embodiment, the common electrode CE is formed as a plurality of strips disposed separately and the pixel electrode P is formed as a whole sheet. In other embodiments, the pixel electrode P can be formed as a plurality of strips disposed separately and the common electrode CE can be formed as a whole sheet. Herein, by the pixel electrode P disposed corresponding to the common electrode CE, the common electrode CE and the pixel electrode P can generate the fringe electric field to control the rotation of the liquid crystal molecules if the semiconductor device S1 is applied to the LCD panel.

Moreover, since the descriptions about the all elements of the semiconductor device S1 have been provided above, they are omitted here for conciseness.

The semiconductor device S1 can further include a passivation layer (not shown), which is disposed on the pixel electrode P and the electrode layer 6 to prevent the external conductor from contacting the pixel electrode P or the electrode layer 6 and thus avoid the accompanying electric interference.

Moreover, the oxide semiconductor layer 4 can be a multi-layer structure.

Figure 21A:
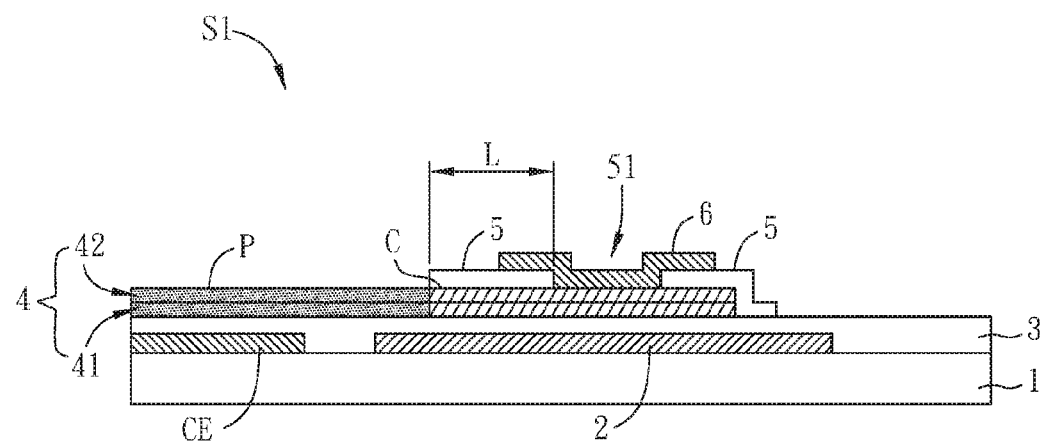
FIGS. 21A and 21B are schematic diagrams of different embodiments of the semiconductor device.
Figure 21B:
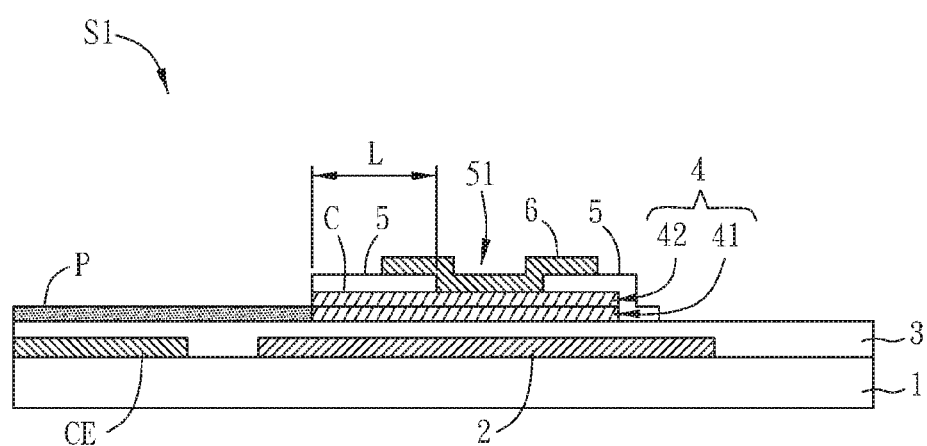
Figure 22:
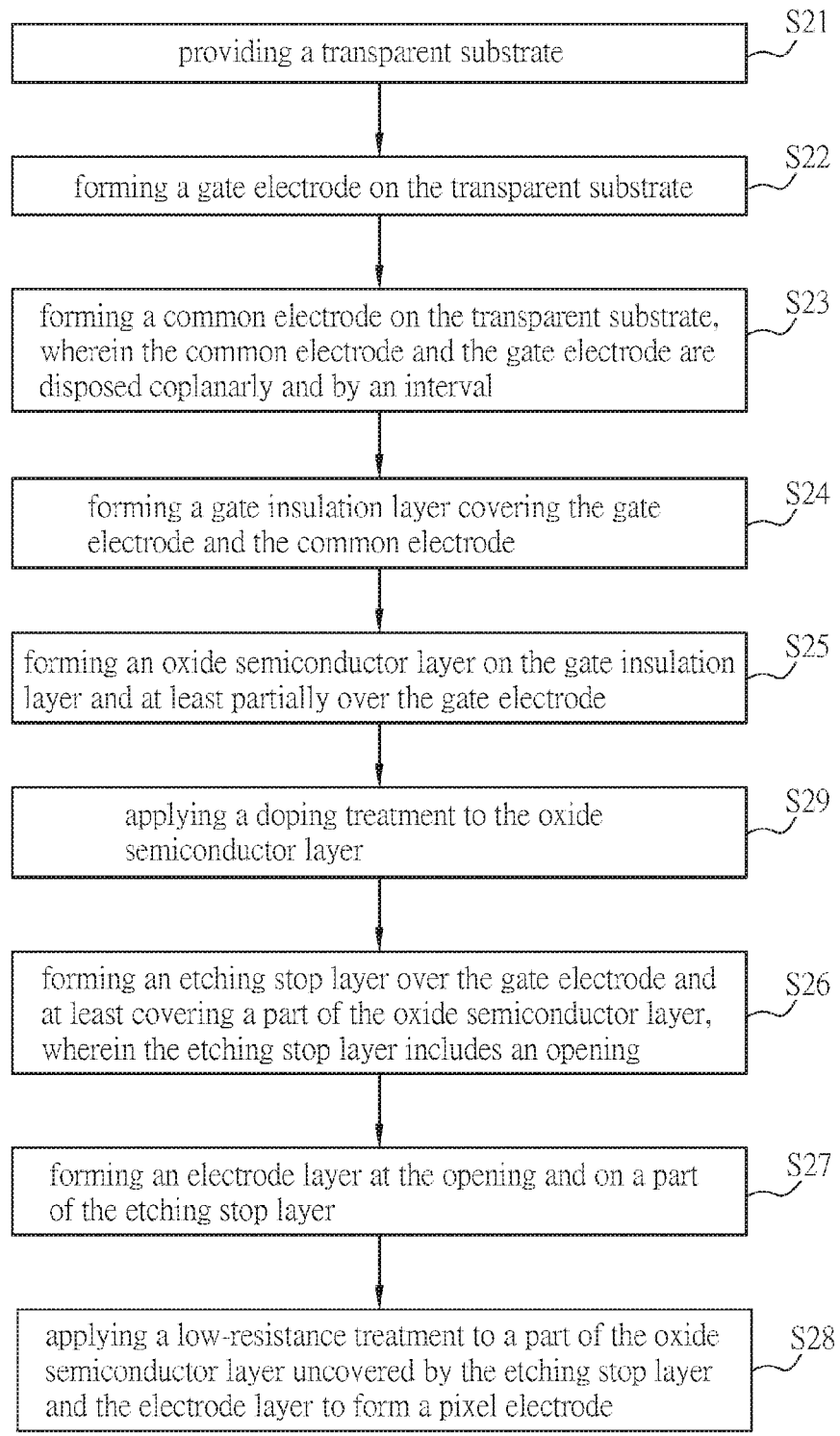
FIG. 22 is a schematic flowchart of a manufacturing method of another semiconductor device of the embodiment of FIG. 14.

FIGS. 21A and 21B are schematic diagrams of different embodiments of the semiconductor device. As shown in FIG. 21A, in this embodiment, the oxide semiconductor layer 4 includes a first oxide semiconductor layer 41 and a second oxide semiconductor layer 42, and the first oxide semiconductor layer 41 is disposed between the gate insulation layer 3 and the second oxide semiconductor layer 42. The second oxide semiconductor layer 42 shown in FIG. 21B is just disposed under the etching stop layer 5 for increasing the sectional area of the channel area C. In these embodiments, the second oxide semiconductor layer 42 can be doped with the p-type impurity such as boron (B) or the n-type impurity such as phosphorus (P), so as to be configured with a better conductivity. Herein, the manufacturing method can further include a step of applying a doping treatment to the oxide semiconductor layer (S29), as shown in FIG. 22. There are two differences between FIG. 22 and FIG. 14. First, in this embodiment, which forming a gate insulation layer covering the gate electrode in step S24. Second, which further applying a doping treatment to the oxide semiconductor layer in step S29. The doping of the n-type impurity can be implemented by using SiH4 and PH3 as the reactant gases and through the plasma-enhanced chemical vapor deposition (PECVD) method, the vapor deposition method or the sputtering method. Moreover, the diffusion method or the ion implantation method also can be used to introduce the impurity elements into the amorphous silicon film, and the favorable case is that heating is used to diffuse the impurity elements after the impurity elements are introduced by using the ion implantation method for example. The doping of the p-type impurity can be implemented, for example, by using SiH4 and B2H6 as the reactant gases and through the plasma-enhanced chemical vapor deposition (PECVD) method, the vapor deposition method or the sputtering method. Moreover, the diffusion method or the ion implantation method also can be used to introduce the impurity elements into the amorphous silicon film, and the favorable case is that heating is used to diffuse the impurity elements after the impurity elements are introduced by using the ion implantation method for example.

Figure 23A:
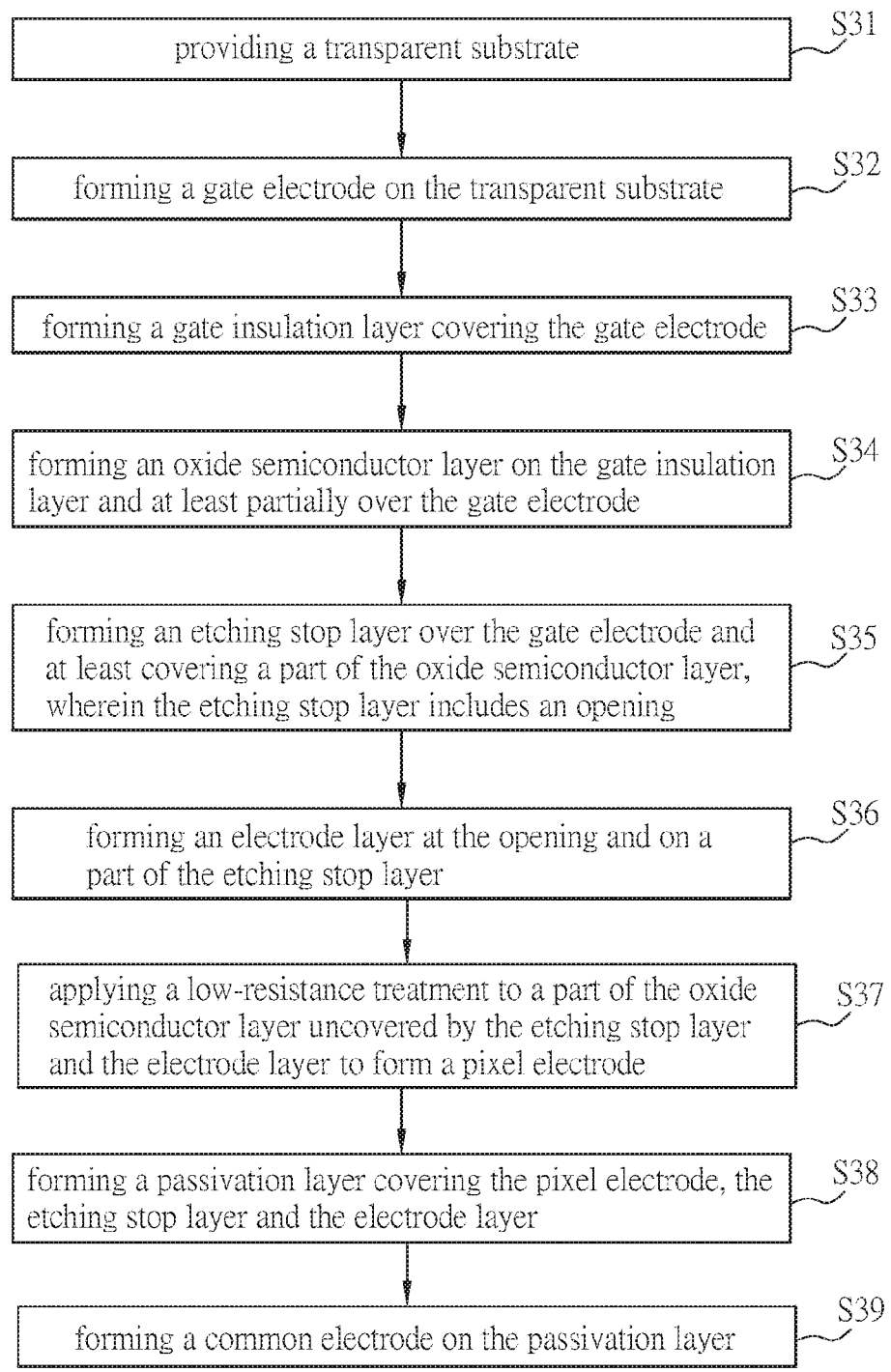
FIG. 23A is a schematic flowchart of a manufacturing method of a semiconductor device of another embodiment.
Figure 23B:
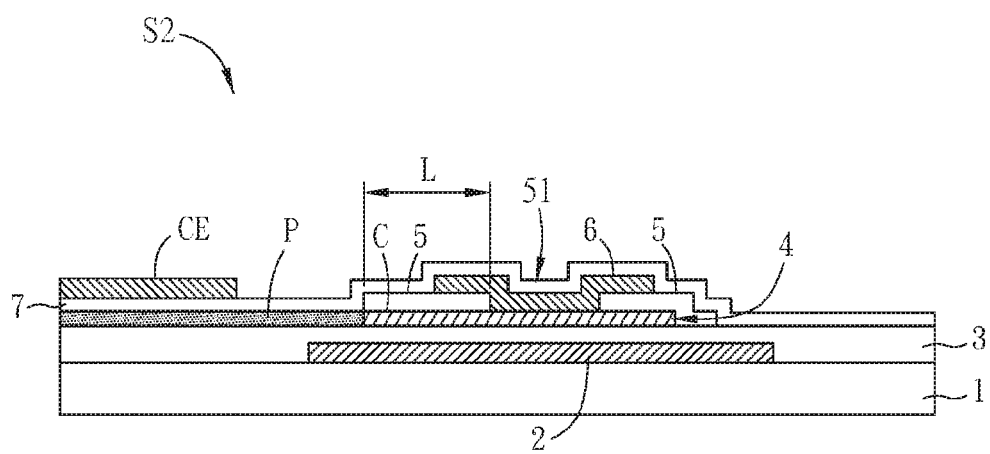
FIG. 23B is a schematic sectional diagram of a semiconductor device of the embodiment of FIG. 23A.

FIG. 23A is a schematic flowchart of the manufacturing method of a semiconductor device of another embodiment, and FIG. 23B is a schematic sectional diagram of a semiconductor device of this embodiment. As shown in FIGS. 23A and 23B, the manufacturing method of this embodiment includes the steps of: providing a transparent substrate (S31); forming a gate electrode on the transparent substrate (S32); forming a gate insulation layer covering the gate electrode (S33); forming an oxide semiconductor layer on the gate insulation layer and at least partially over the gate electrode (S34); forming an etching stop layer over the gate electrode and at least covering a part of the oxide semiconductor layer, wherein the etching stop layer includes an opening (S35); forming an electrode layer at the opening and on a part of the etching stop layer (S36); applying a low-resistance treatment to a part of the oxide semiconductor layer uncovered by the etching stop layer and the electrode layer to form a pixel electrode (S37); forming a passivation layer covering the pixel electrode, the etching stop layer and the electrode layer (S38); and forming a common electrode on the passivation layer (S39). In short, the difference between the semiconductor device S2 of this embodiment and the above embodiment is that the common electrode CE of this embodiment is formed over the pixel electrode P, and that is, the relative position between the common electrode CE and the pixel electrode P is reversed.

Physically, in this embodiment, the common electrode CE of the semiconductor device S2 is formed after the pixel electrode P, and that is, after the low-resistance treatment of the step S37, the steps S38 and S39 are implemented as: disposing a passivation layer 7 and disposing the common electrode CE on the passivation layer 7. Furthermore, the passivation layer 7 can be formed by the CVD method for example, and covers the pixel electrode P, the etching stop layer 5 and the electrode layer 6 to act as the protection layer, so as to prevent the external conductor from electrically interfering with the pixel electrode P or the electrode layer 6. The material of the passivation layer 7 is, for example, $SiO_x$, $SiN_x$, $SiO_xN_y$, $Al_2O_3$, AlN or polyimide (PI). Herein, the common electrode CE is formed on the passivation layer 7, especially over the pixel electrode P, so that the common electrode CE and the pixel electrode P can generate the fringe electric field to control the rotation of the liquid crystal molecules if the semiconductor device S2 is applied to the LCD panel. The material of the common electrode CE is the same as the above embodiment. If the IGZO is used as the common electrode CE, it can be subjected to a low-resistance treatment to form the common electrode, and the related descriptions have been provided above so they are omitted here for conciseness.

Moreover, the steps and the elements of this embodiment also can be comprehended by referring to the above embodiments, so the related descriptions are omitted here for conciseness.

Summarily, in the semiconductor device and the manufacturing method thereof according to this invention, the part of the oxide semiconductor layer uncovered by the etching stop layer is subjected to the low-resistance treatment to become the pixel electrode and there is thus no need to dispose an additional pixel electrode layer. Therefore, the photo engraving process can be saved and the tolerance resulted from the formation of the pixel electrode layer also can be avoided.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A semiconductor device, comprising:
a transparent substrate;
a gate electrode disposed on the transparent substrate;
a gate insulation layer covering the gate electrode;
an oxide semiconductor layer disposed on the gate insulation layer and at least partially over the gate electrode;
an etching stop layer disposed over the gate electrode and at least covering a part of the oxide semiconductor layer, and including an opening; and
an electrode layer disposed at the opening and on a part of the etching stop layer;
wherein a part of the oxide semiconductor layer uncovered by the etching stop layer and the electrode layer is a pixel electrode.

2. The semiconductor device as recited in claim 1, further comprising a common electrode disposed on the transparent substrate, wherein the common electrode and the gate electrode are disposed coplanarly and by an interval and the gate insulation layer further covers the common electrode.

3. The semiconductor device as recited in claim 2, wherein the material of the common electrode includes ITO, IZO, FTO, AZO, GZO or IGZO.

4. The semiconductor device as recited in claim 1, further comprising:
a passivation layer covering the pixel electrode, the etching stop layer and the electrode layer; and
a common electrode disposed on the passivation layer.

5. The semiconductor device as recited in claim 4, wherein the material of the common electrode includes ITO, IZO, FTO, AZO, GZO or IGZO.

6. The semiconductor device as recited in claim 5, wherein the material of the common electrode is IGZO, and the common electrode is subjected to a low-resistance treatment to become an electrode.

7. The semiconductor device as recited in claim 1, wherein the electrode layer is electrically connected with the oxide semiconductor layer through the opening.

8. The semiconductor device as recited in claim 1, wherein the oxide semiconductor layer is a multi-layer structure.

9. The semiconductor device as recited in claim 1, wherein the material of the gate insulation layer includes SiOx, SiNx, SiOxNy or polyimide (PI).

10. The semiconductor device as recited in claim 1, wherein the material of the oxide semiconductor layer includes IGZO.

11. The semiconductor device as recited in claim 1, wherein the part of the oxide semiconductor layer connected to the pixel electrode from the electrode layer is a channel area.

12. The semiconductor device as recited in claim 1, wherein the oxide semiconductor layer includes a first oxide semiconductor layer and a second oxide semiconductor layer, the first oxide semiconductor layer is disposed between the gate insulation layer and the second oxide semiconductor layer, and the second oxide semiconductor layer is doped with p-type impurity or n-type impurity.

13. The semiconductor device as recited in claim 1, wherein the pixel electrode further includes a first oxide semiconductor layer and a second oxide semiconductor layer.

* * * * *